(12) United States Patent
Fukuda

(10) Patent No.: US 7,446,941 B2
(45) Date of Patent: Nov. 4, 2008

(54) DISPLAY APPARATUS

(75) Inventor: Kazuhiro Fukuda, Kanagawa (JP)

(73) Assignee: Sony Corporation (JP)

( * ) Notice: Subject to any disclaimer, the term of this patent is extended or adjusted under 35 U.S.C. 154(b) by 60 days.

(21) Appl. No.: 11/523,549

(22) Filed: Sep. 19, 2006

(65) Prior Publication Data

US 2008/0239499 A1    Oct. 2, 2008

(30) Foreign Application Priority Data

Sep. 22, 2005    (JP)    ............................ P2005-276159

(51) Int. Cl.
G02B 27/10    (2006.01)
(52) U.S. Cl. .................................... 359/619
(58) Field of Classification Search .......... 359/618–626
See application file for complete search history.

(56) References Cited

U.S. PATENT DOCUMENTS 5,748,375 A * 5/1998 Yamana ...................... 359/622
6,215,593 B1 * 4/2001 Bruce ......................... 359/619
2002/0114077 A1 * 8/2002 Javidi ......................... 359/618

FOREIGN PATENT DOCUMENTS

JP    2003-121779 A    4/2003

* cited by examiner

*Primary Examiner*—Alicia M Harrington
(74) *Attorney, Agent, or Firm*—Lerner, David, Littenberg, Krumholz & Mentlik, LLP

(57)    ABSTRACT

A display apparatus includes an image display unit having a plurality of pixels arranged on a predetermined curved surface; and a plurality of microlenses arranged on the predetermined curved surface such that they correspond to and face the plurality of pixels on the image display unit. Light rays that exit from the plurality of microlenses are collected into the eye so that a virtual image is placed at a position apart from the eye by at least a distance of distinct vision.

8 Claims, 9 Drawing Sheets

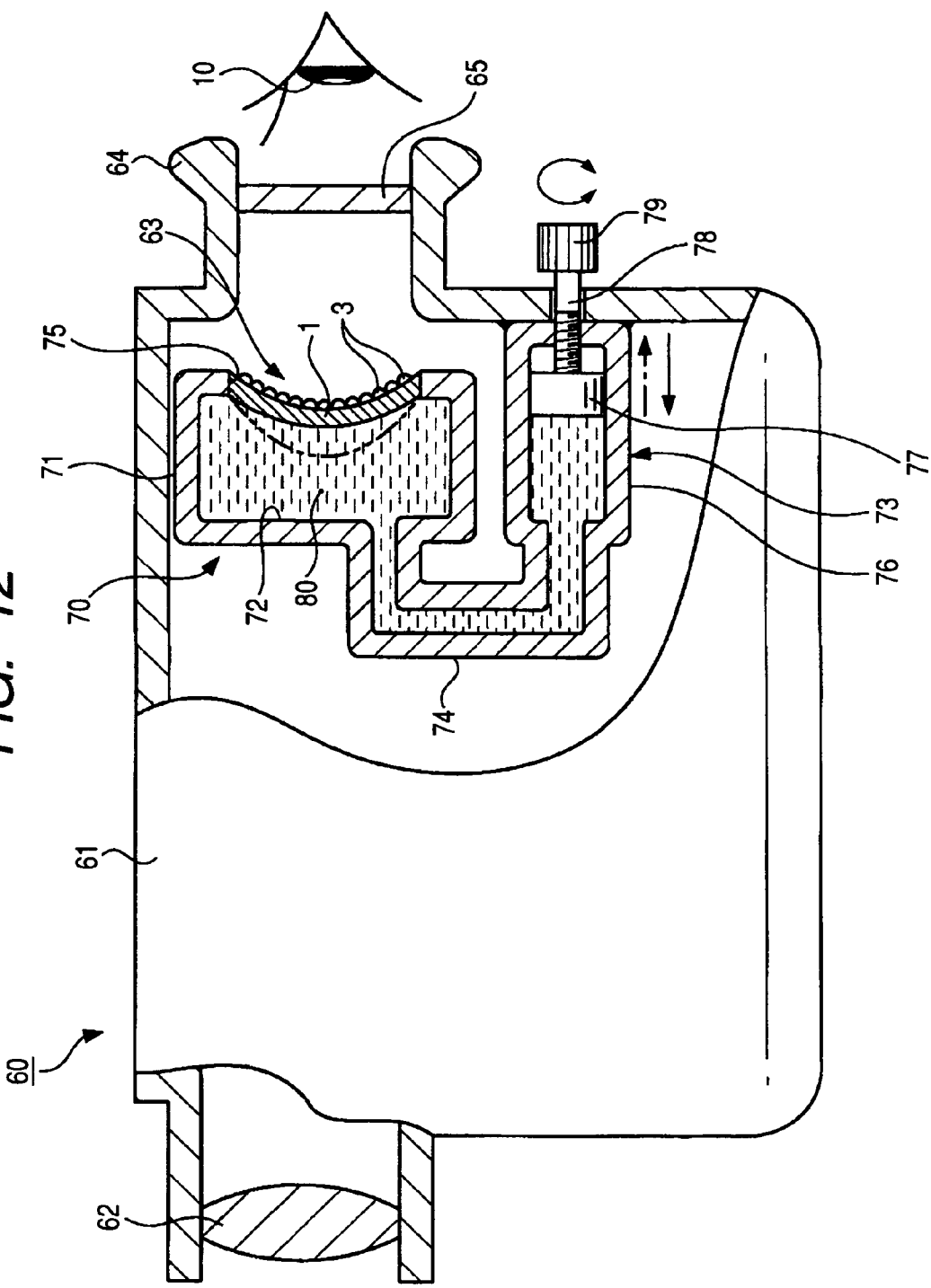

DISPLAY APPARATUS

CROSS-REFERENCE TO RELATED APPLICATIONS

The present application claims priority from Japanese Patent Application No. JP 2005-276159 filed on Sep. 22, 2005, the disclosure of which is hereby incorporated by reference herein.

BACKGROUND OF THE INVENTION

1. Field of the Invention

The present invention relates to a display apparatus that allows enlarged monocular or binocular viewing of a display surface located within the near point of the eye and clear visualization of the substantially entire display surface.

2. Description of the Related Art

An example of display apparatus of this type of related art is described in JP-A-2003-121779. JP-A-2003-121779 describes a display apparatus that allows enlarged monocular viewing of displayed contents. The display apparatus described in JP-A-2003-121779 includes means for displaying self-luminous images, the means having two-dimensionally arranged pixels, micro luminous points, each of which corresponding to each of the pixels of the means for displaying images and being part of that pixel, and micro optical elements that direct outgoing light rays from the two-dimensionally arranged micro luminous points. The optical axis connecting each of the micro luminous points and the corresponding micro optical element effectively intersects at a predetermined point located within the near point of the eye, and each of the micro optical elements is disposed such that it creates an virtual image of the corresponding micro luminous point at a position apart from the predetermined point by at least the distance of distinct vision.

According to the display apparatus having such a configuration described in JP-A-2003-121779, it is expected to provide an advantage in reducing the weight and thickness of a display apparatus that allows short-distance, enlarged monocular viewing of displayed contents.

However, in the display apparatus of the related art described in JP-A-2003-121779, the plurality of pixels are arranged on a planar surface in a two-dimensional manner, and a plurality of microlenses, which are the micro optical elements, are similarly arranged on the planar surface in a two-dimensional manner in such a way that they correspond to the pixels. Thus, the distance between the eye and the pixel at the center is the shortest, while the distance progressively increases when approaching the periphery in the radial direction away from the center. Therefore, setting the display apparatus to provide a clear view at the center causes a blurred image at the periphery, so that the viewer may not clearly view the entire visualized image.

It is desirable to solve the problem that in the display apparatus of the related art, the plurality of pixels and the plurality of microlenses are arranged on a planar surface in a two-dimensional manner, so that the viewer may not clearly view the entire image.

SUMMARY OF THE INVENTION

A display apparatus according to an embodiment of the invention includes image display means having a plurality of pixels arranged on a predetermined curved surface, and a plurality of microlenses arranged on the predetermined curved surface such that they correspond to and face the plurality of pixels on the image display means. The light rays that exit from the plurality of microlenses are collected into the eye, so that a virtual image is placed at a position apart from the eye by at least the distance of distinct vision.

In the display apparatus according to an embodiment of the invention, the plurality of pixels and the plurality of microlenses are arranged on the predetermined curved surface such that they face each other and the light rays that exit from the plurality of microlenses are collected into the eye so that the predetermined virtual image is clear and distinct across the image.

BRIEF DESCRIPTION OF THE DRAWINGS

FIG. 12 is a cross-sectional view for explaining the main portion of a camera-integrated VTR illustrating a second example of an image-pickup instrument provided with the display apparatus according to an embodiment of the invention.

DETAILED DESCRIPTION

A display apparatus that allows a clear and distinct view of an entire predetermined virtual image is achieved in a simple configuration.

Figure 2:
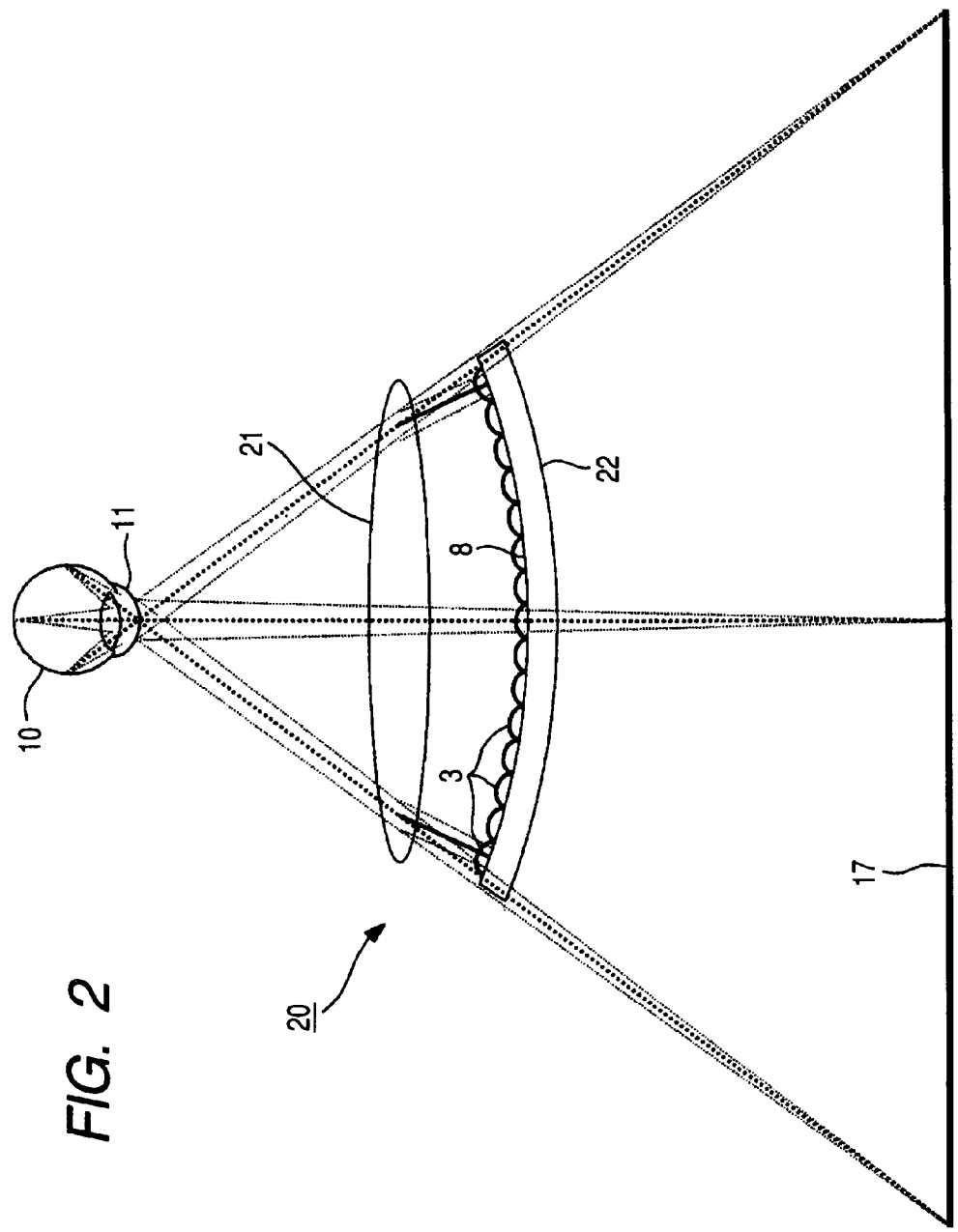
FIG. 2 is a view for explaining a second example of the display apparatus according to an embodiment of the invention.
Figure 3:
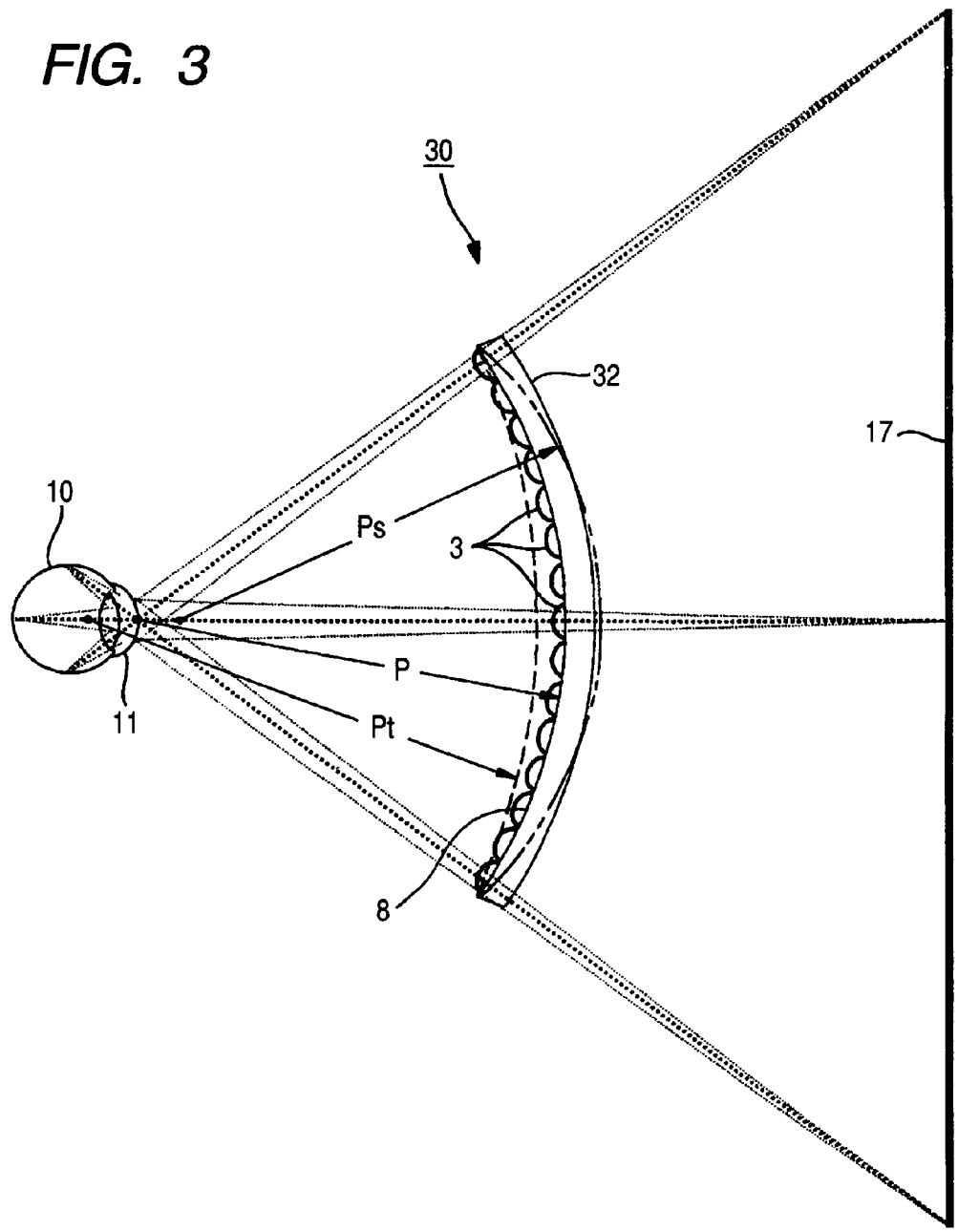
FIG. 3 is a view for explaining a third example of the display apparatus according to an embodiment of the invention.
Figure 4:
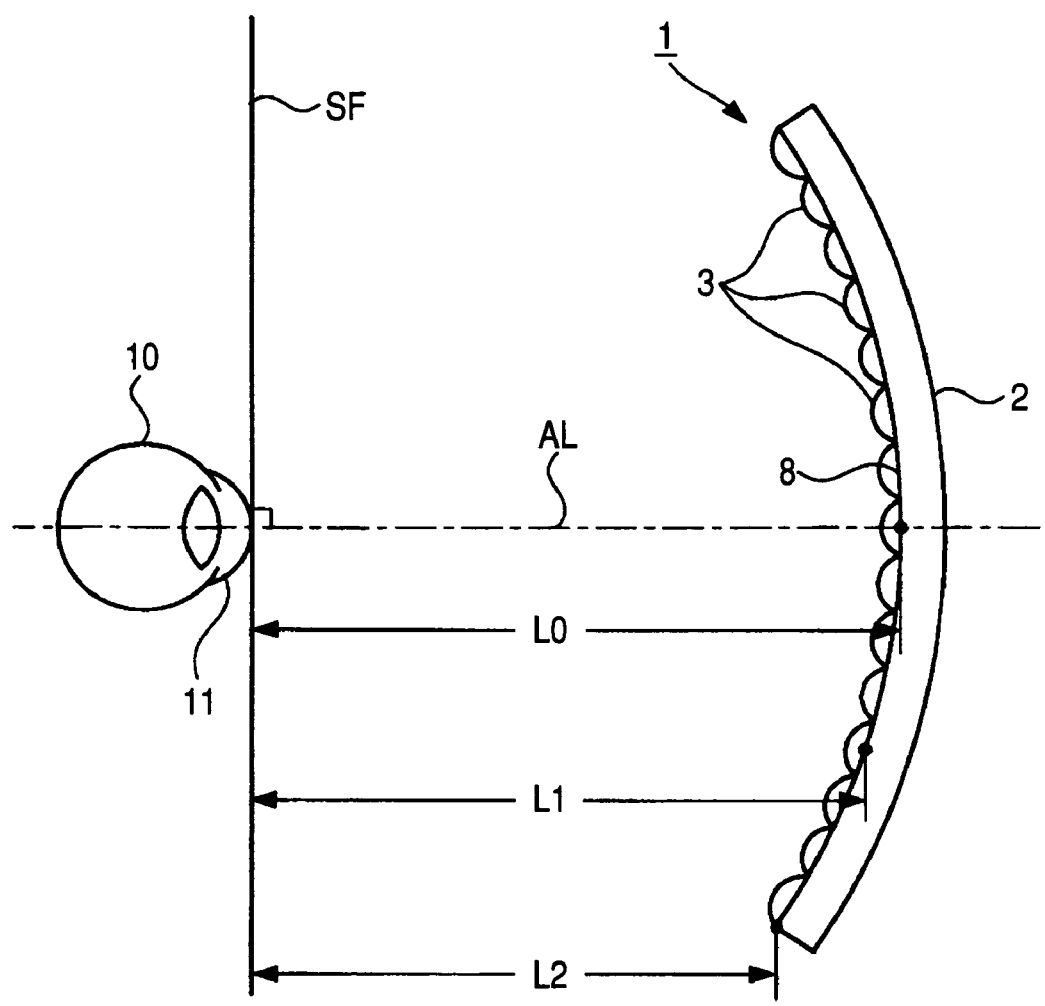
FIG. 4 is a view for explaining a predetermined curved surface of the display apparatus according to an embodiment of the invention.
Figure 5:
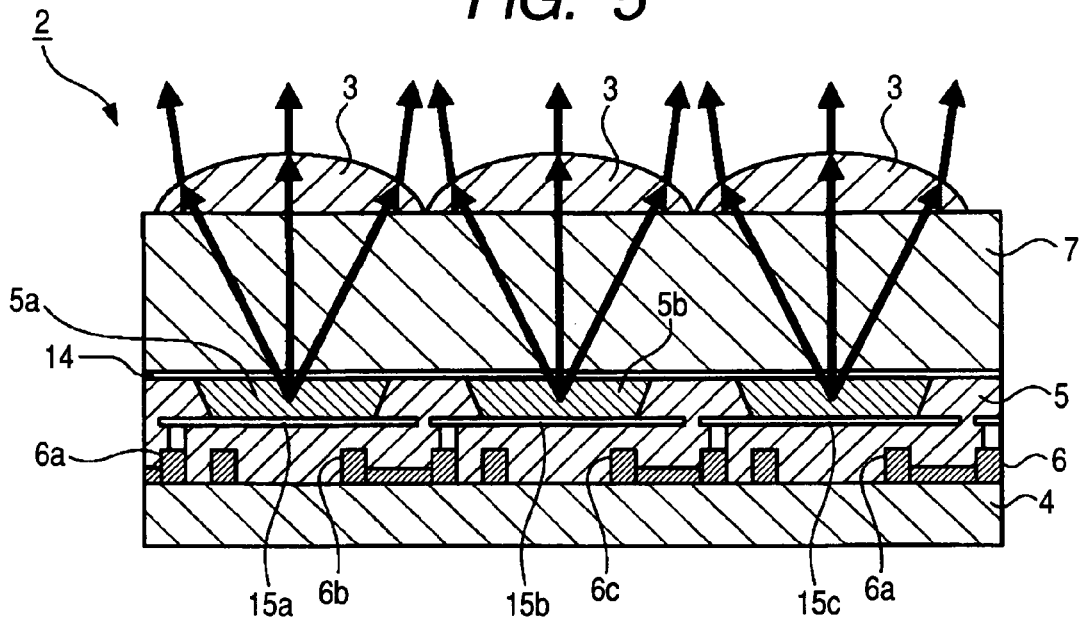
FIG. 5 is a view for explaining the main portion of an organic EL display illustrating image display means of the display apparatus according to an embodiment of the invention.
Figure 6:
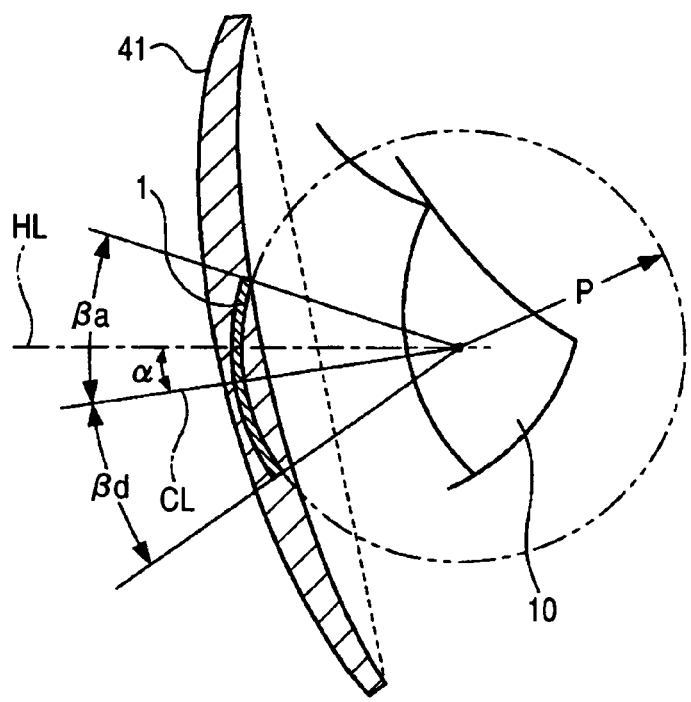
FIG. 6 is a view for explaining an example in which the display apparatus according to an embodiment of the invention is applied to eyeglasses.
Figure 7:
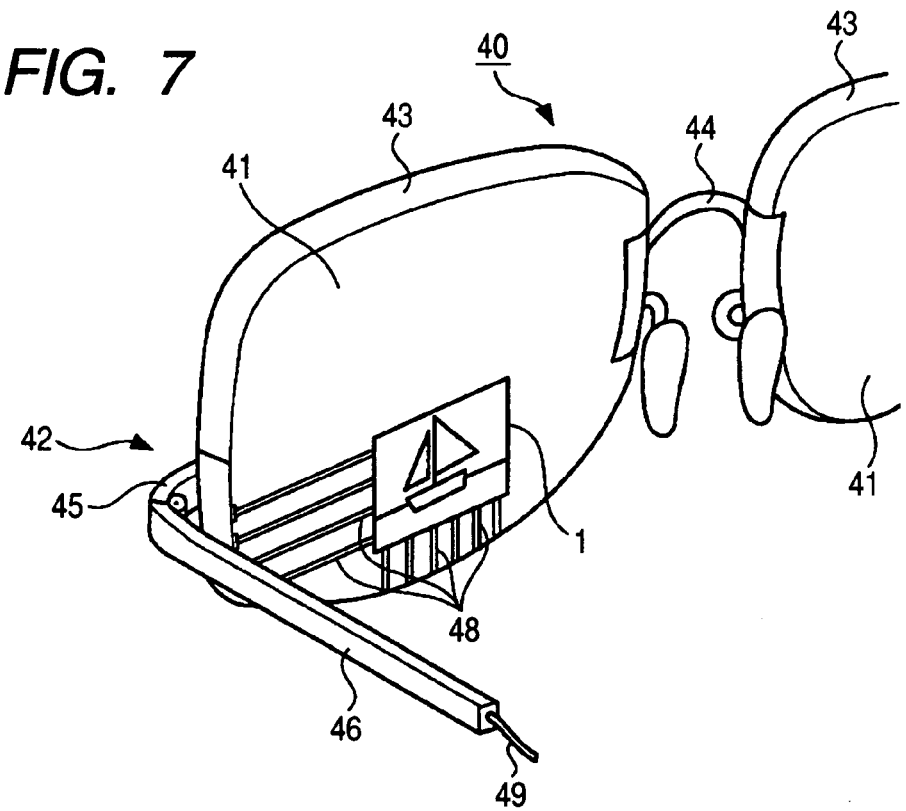
FIG. 7 is a view for explaining the main portion of the eyeglasses provided with the display apparatus according to an embodiment of the invention.
Figure 8:
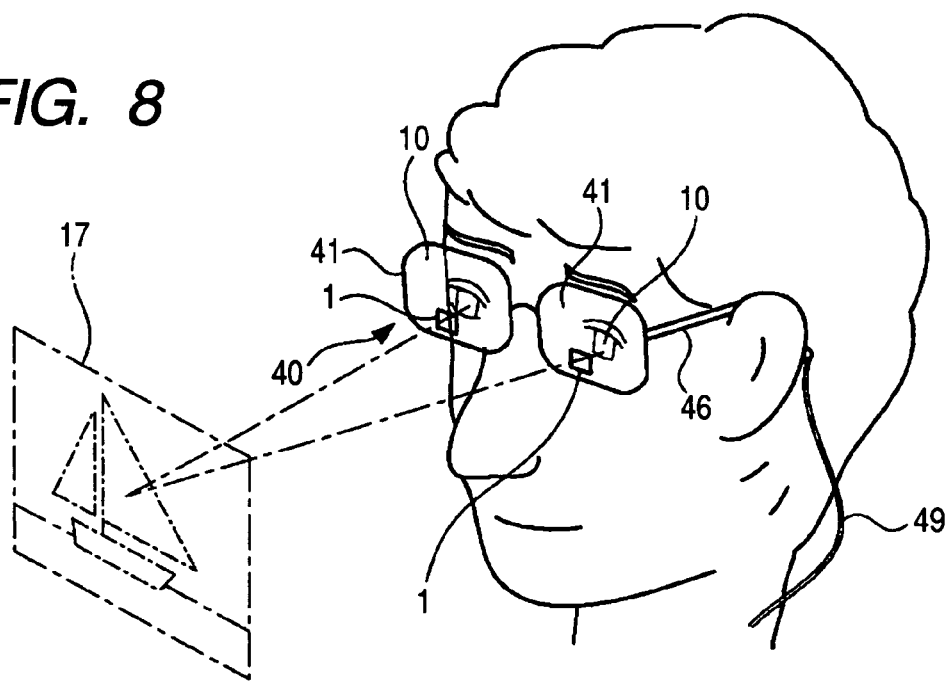
FIG. 8 is a view for explaining how the eyeglasses shown in FIG. 7 are used.
Figure 9:
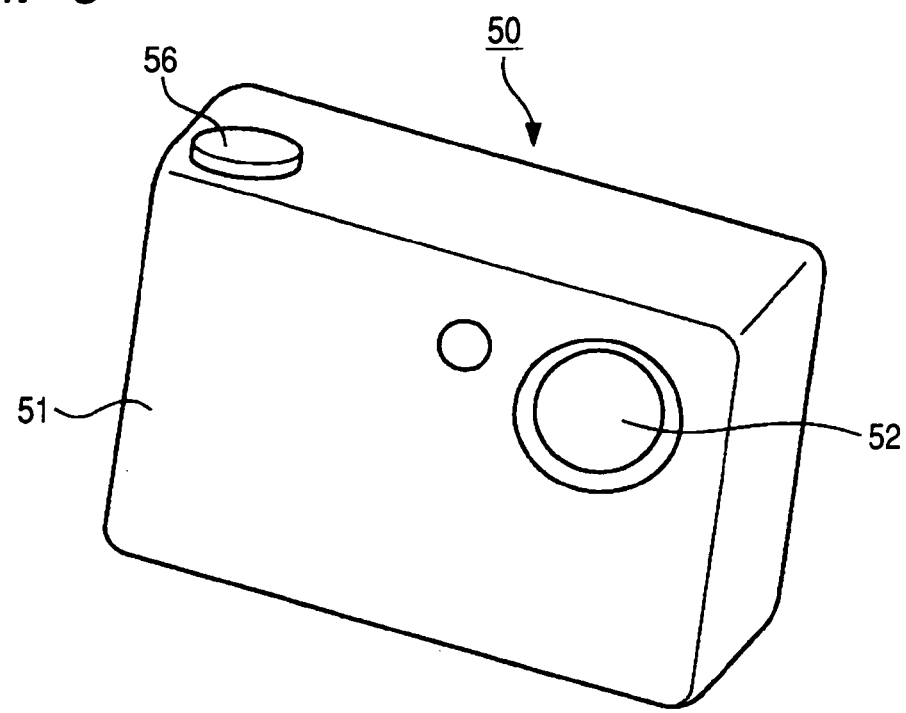
FIG. 9 is a view for explaining an electronic still camera illustrating a first example of an image-pickup instrument provided with the display apparatus according to an embodiment of the invention when viewed from the front side.
Figure 10:
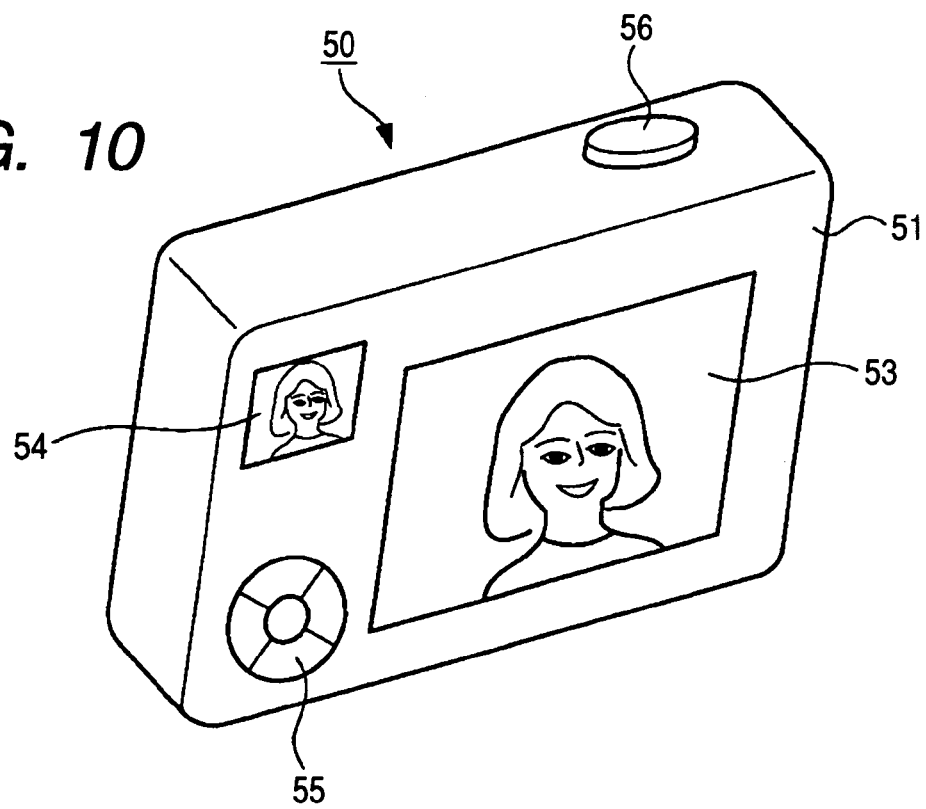
FIG. 10 is a view for explaining the electronic still camera illustrating the first example of an image-pickup instrument provided with the display apparatus according to an embodiment of the invention when viewed from the rear side.
Figure 11:
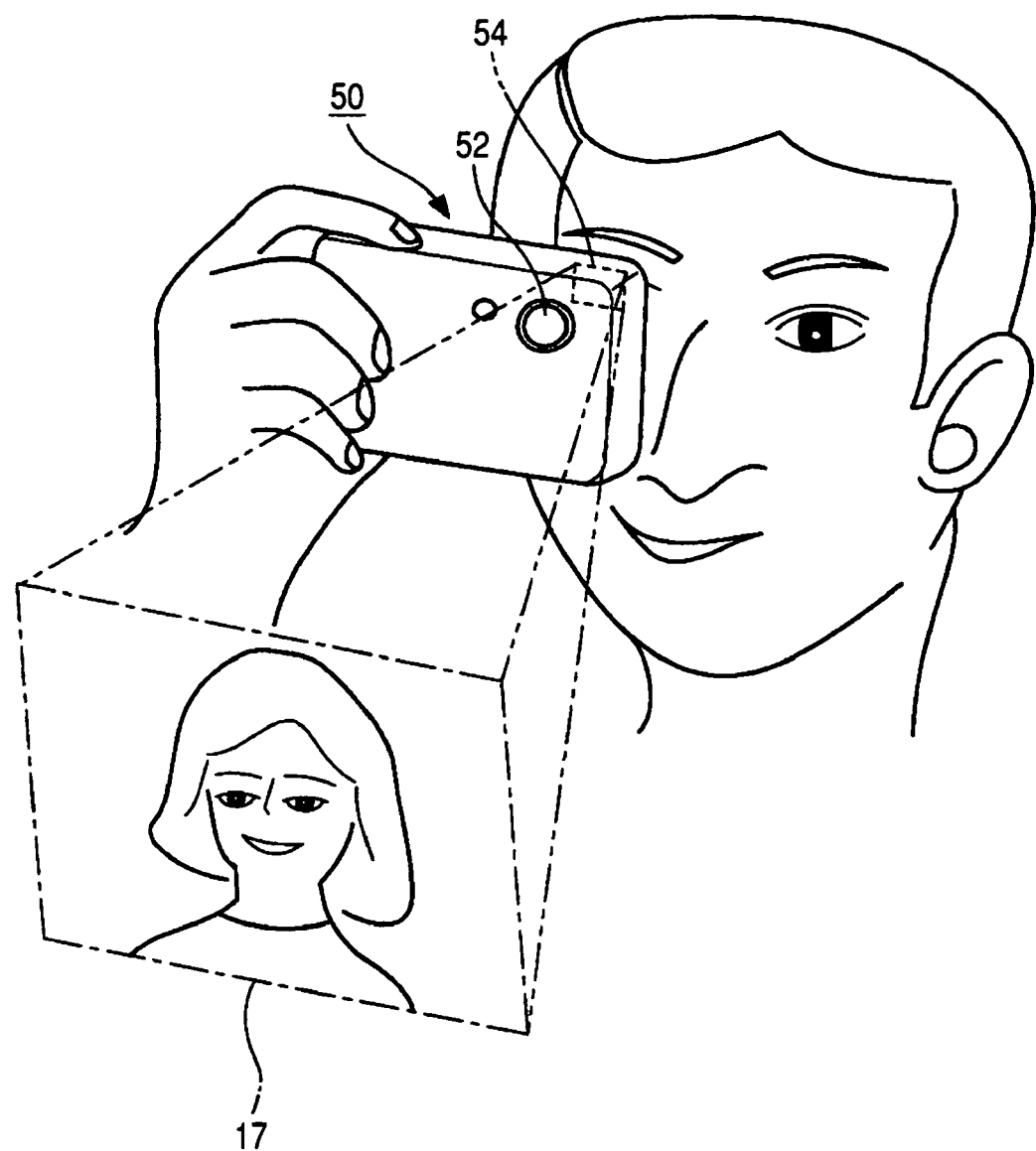
FIG. 11 is a view for explaining how the electronic still camera shown in FIG. 9 is used.

Embodiments of the invention will be described below with reference to the drawings. FIGS. 1 to 12 explain exemplary embodiments of the invention. That is, FIG. 1 explains a first example of the display apparatus according to an embodiment of the invention. FIG. 2 explains a second example. FIG. 3 explains a third example. FIG. 4 explains a curved surface of the display apparatus according to an embodiment of the invention. FIG. 5 explains one example of the image display means according to an embodiment of the invention. FIG. 6 explains the eyeglasses to which the invention is applied. FIG. 7 explains the main portion of the eyeglasses. FIG. 8 explains how the eyeglasses are used. FIG. 9 is a front perspective view of one example of the electronic still camera to which the invention is applied. FIG. 10 is a rear perspective view of the electronic still camera. FIG. 11 explains how the electronic still camera is used. FIG. 12 is a cross-sectional view for explaining the main portion of a video camcorder.

Figure 1:
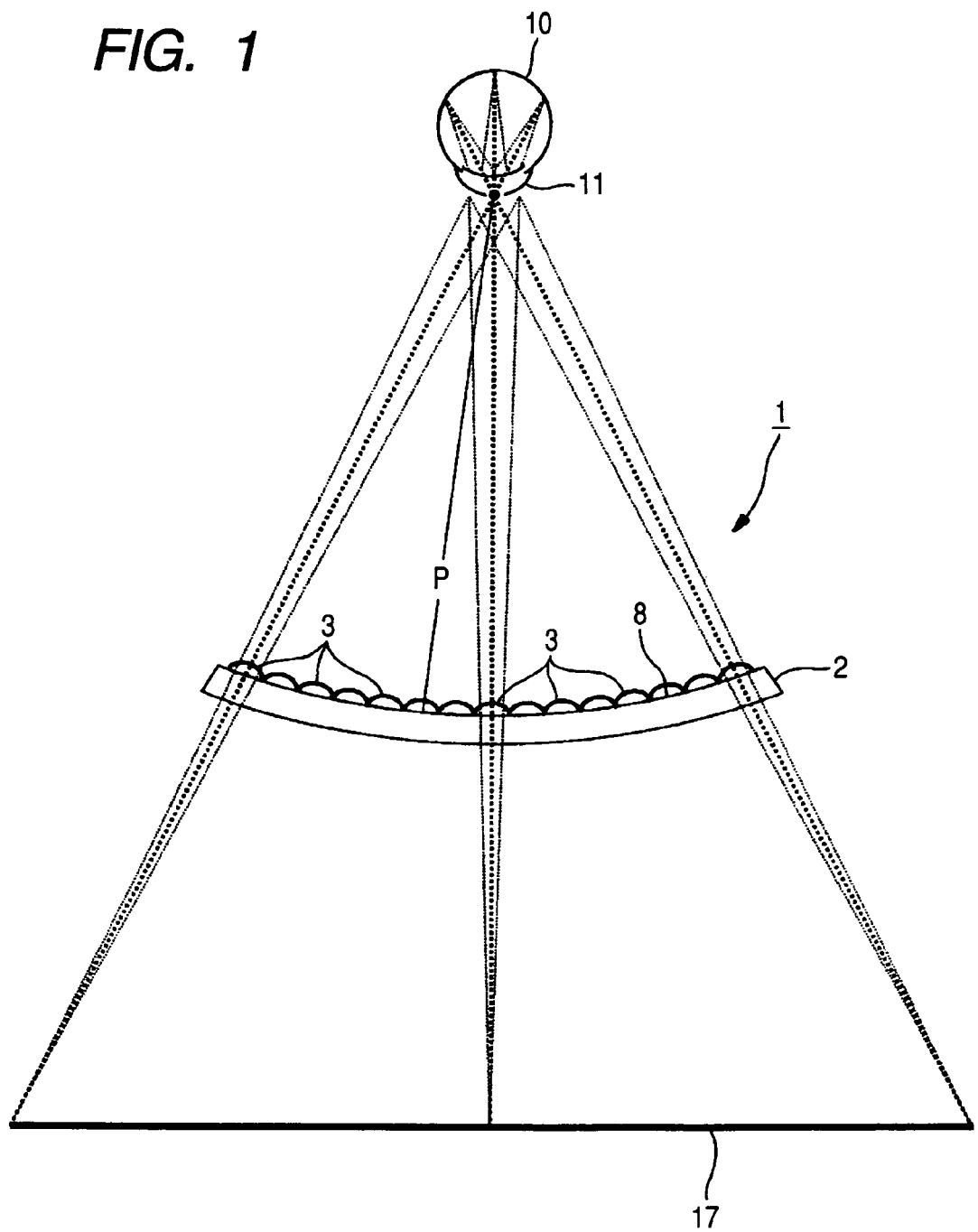
FIG. 1 is a view for explaining a first example of the display apparatus according to an embodiment of the invention.

As shown in FIG. 1, the display apparatus 1 according to an embodiment of the invention includes an organic EL (electroluminescence) display 2, which is a self-luminous display element illustrating a first specific example of image display means, the means having a plurality of pixels. The display apparatus 1 also includes a plurality of microlenses integrally provided on one side of the organic EL display 2. At least one side of the organic EL display 2 is shaped into a spherical surface (part of a sphere) 8, which illustrates a first specific example of a predetermined curved surface. The plurality of microlenses 3 are disposed substantially across the spherical surface 8 in an aligned manner.

The term "predetermined curved surface" used herein is not limited to the "spherical surface" (having a constant radius of curvature ρ) 8 according to this example, but of course includes differently sized spherical surfaces created by changing the value of the radius of curvature ρ as well as other surfaces, such as an "aspherical surface" in which the curvature varies depending on locations thereon. The term "aspherical surface" used herein includes a paraboloidal surface, hyperboloidal surface, quadratic surface and approximation thereof. The predetermined curved surface may be a "cylindrical curved surface" created by cutting away part of a cylinder. The "cylindrical curved surface" as the predetermined curved surface is more easily viewable than a planar surface and can be created only by bending a planar surface in one direction, providing an advantage over a spherical surface in terms of manufacturability.

The "curved surface" of the display apparatus 1 according to an embodiment of the invention will be described in further detail with reference to FIG. 4. In FIG. 4, reference number 10 denotes the eye, reference number 11 denotes the pupil, reference character AL denotes the center line of sight (optical axis) of the eye 10, and reference character SF denotes the planar surface that is approximately located at the position of the eye 10 and perpendicular to the optical axis AL. The curved surface according to an embodiment of the invention is configured such that both peripheries are closer to the eye in the direction of the optical axis AL, which is the viewing direction, than the center of the display screen of the display apparatus 1. That is, letting L0 be the distance from the planar surface SF to the center of the display screen, L1 be the distance from the planar surface SF to an arbitrary midway point in the radial direction outward from the center of the display screen, and L2 be the distance from the planar surface SF to the periphery of the display screen, the relationship of L0>L1>L2 is satisfied.

The plurality of microlenses 3 are disposed on the concave side of the spherical surface 8, which is one side of the organic EL display 2 having such a predetermined curved surface, such that the microlenses 3 face a plurality of corresponding pixels arranged on the concave side of the spherical surface 8 in a one-to-one relationship.

The organic EL display 2 has a structure, for example, shown in FIG. 5. That is, the organic EL display 2 includes a first glass substrate 4, a plurality of organic EL elements 5 and TFTs (thin film transistors) 6 provided on one side of the first glass substrate 4, and a second glass substrate 7 that holds the organic EL elements 5 and the like sandwiched between the first glass substrate 4 and the second glass substrate 7. The concave-side surface of the second glass substrate 7 forms the spherical surface 8, which is the predetermined curve surface.

The organic EL element 5 of the organic EL display 2 includes a three-color combination of a red organic EL element 5a, green organic EL element 5b and blue organic EL element 5c, which corresponds to the three primary colors. Among the three-color organic EL elements 5a to 5c, one organic EL element 5 with an appropriate color is disposed at the center of the spherical surface 8, from which the three-color organic EL elements 5a to 5c are alternately arranged with a predetermined interval in the circumferential direction and in the outward radial direction by a necessary number of rows. The plurality of microlenses 3 are disposed on the spherical surface 8 such that they face and overlie the respective organic EL elements 5a to 5c in a one-to-one relationship to form an integral structure.

Each of the plurality of microlenses 3 is shaped into a half convex lens. By collecting the light rays that exit the plurality of microlenses 3 into the eye of the user of the display apparatus 1, a virtual image is located at a position apart from the eye by at least the distance of distinct vision. That is, the optical axes of all microlenses 3 effectively intersect at the pupil 11 of the eye 10 of the user of the display apparatus 1 or in the vicinity thereof. By thus arranging the plurality of microlenses 3 on a spherical surface having an appropriate radius of curvature p, the eye 10 can focus on a position that is much closer to the eye (5 mm to 40 mm) than a position on which the eye can normally focus (250 mm, for example), and the virtual image can be located at a position from the eye apart by at least the distance of distinct vision.

The human eye is assumed to have a limit in the range of 80 mm and 100 mm in average from the pupil 11, called a near point on which the eye can physiologically focus without any effort. Thus, provided that the distance of distinct vision is 250 mm, the distance between the display surface and the eye (pupil), which is the predetermined point, is advantageously set to about 5 to 50 mm, while the distance between the predetermined point and the position where the virtual image is placed is set to 250 mm to infinity, preferably 1 to 5 m.

A translucent film (electrode) 14 that is a cathode of the TFTs (thin film transistors) 6 is provided on the second glass substrate 7 side of the organic EL elements 5a to 5c. Metal electrodes 15a to 15c that are anodes of the TFTs 6 are provided on the opposite side of the organic EL elements 5a to 5c from the second glass substrate 7. These metal electrodes 15a to 15c, the translucent film 14 and other wirings form the TFTs (thin film transistors) 6a to 6c disposed in such a way that they correspond to the organic EL elements 5a to 5c.

By applying a voltage across the translucent film 14 and any of the metal electrodes 15a to 15c of the TFTs 6a to 6c disposed in such a way that they correspond to the organic EL elements 5a to 5c, the corresponding one of the organic EL elements 5a to 5c can emit light of its color. That is, the red organic EL element 5a emits red light, the green organic EL element 5b emits green light, the blue organic EL element 5c emits blue light. The light of each color produced in the light emission process passes through the translucent film 14 and the second glass substrate 7, passes through the microlens 3 disposed in such a way that it faces the corresponding organic EL element, and exits from the microlens 3.

At the same time, part of the light produced in the light emission process that is directed toward the first rear glass substrate 4 side is reflected from the metal electrodes 15a to 15c disposed on the first glass substrate 4 side toward the second glass substrate 7 side. The light thus reflected from the metal electrodes 15a to 15c is superimposed on the light that is directed toward the front side. The combined light passes through the translucent film 14 and the second glass substrate 7, and exits through the microlens 3 disposed downstream of the metal electrode 15a.

According to the display apparatus 1 having such a configuration, as shown in FIG. 1, by configuring the light that exits from each of the microlenses 3 such that it substantially intersects the pupil 11 of the eye 10 or in the vicinity thereof, the viewer does not recognize the spherical surface 8, which is the display screen located too close to the viewer, but can view a virtual image 17 enlarged by the microlens array based on the same principle as a magnifier. Moreover, according to the invention, the plurality of microlenses 3 are disposed on the spherical surface 8, and the distance between the pupil 11 and the center of the display screen is made equal to the distance between the pupil 11 and the both edges of the display screen or the difference between these two distances is reduced, so that the entire spherical surface 8, which is the display screen, can be clearly visualized. That is, as the display screen is shaped into a spherical surface, the display apparatus 1 can be small while allowing the large virtual image 17 to be distinctly viewed without a large optical system.

FIG. 2 shows a second example of the invention. A display apparatus 20 shown in the second example includes a convex lens 21, which is one specific example of an optical lens, located between the eye 10 and the plurality of microlenses 3 disposed on the spherical surface 8 in the previous example, so that the viewer can view an enlarged virtual image 17.

The convex lens 21 is disposed such that its optical axis coincides with the center of an organic EL display 22. In this case, the convex lens 21 converges the incoming light rays inward and the converged light rays that exit from the convex lens 21 are collected at the pupil 11 of the eye 10 or in the vicinity thereof. Consequently, inserting the convex lens 21 can further enlarge the image displayed on the spherical display screen formed by the plurality of organic EL elements 5a to 5c and the plurality of microlenses 3 of the organic EL display 22, while the enlarged virtual image 17 can be clearly viewed. Moreover, the optical lens inserted between the eye 10 and the organic EL display 22 will not bend the traveling direction of the light rays, so that the virtual image 17 can be viewed in a natural manner for increased viewability.

FIG. 3 shows a third example of the invention. A display apparatus 30 shown in the third example has the spherical surface 8, which is the display screen of the organic EL display 2 in the first example, with variable curvature. In the display apparatus 30 according to this example, the variable curvature of the spherical surface 8, which is the display screen of an organic EL display 32, hence the variable radius of curvature ρ of the spherical surface 8 allows a larger or smaller magnification of the resultant virtual image 17, so that the viewer can view the virtual image 17 with different sizes.

For example, when the radius of curvature ρ of the spherical surface 8 is a small radius of curvature ρs (ρ>ρs), the degree of concavity of the spherical surface 8 becomes large, so that the virtual image 17 to be viewed can be further enlarged (zoom capability). In contrast, when the radius of curvature ρ of the spherical surface 8 is a large radius of curvature ρt (ρ<ρt), the degree of concavity of the spherical surface 8 becomes small, so that the virtual image to be viewed can be smaller.

In this example, although the description has been given with reference to the example in which the organic EL display 2 that is a self-luminous display element is used as the image display means, the invention is not limited thereto, but may be applied to, for example, a backlighted liquid crystal display. In this case, the liquid crystal display includes a liquid crystal display element having a plurality of liquid crystal cells, and a backlight as a light emitting portion that is disposed at the rear or side of the liquid crystal display element and illuminates the liquid crystal cells, which are liquid crystal pixels.

The liquid crystal display is classified into a matrix-shaped type, a segment-shaped type and the like when classified in terms of the shape of display electrodes formed on the inner surfaces of two opposing glass plates. On the other hand, a transmission-type liquid crystal display cell has two transparent electrodes, while a reflection-type liquid crystal display cell has one transparent electrode and a reflection film as the other electrode. Using a liquid crystal display (LCD) having such a configuration, the voltage applied across the electrodes is controlled to control whether the light rays is transmitted or blocked, or control the amount of light transmission, allowing a desired image to be displayed on the display screen.

The image display means includes, besides these examples, a plasma display panel (PDP), and may even include a light emitting diode (LED), an electrochromic display (ECD) and a fluorescent display tube.

FIGS. 6 to 8 explain an example in which the display apparatus 1 having the configuration described above is integrated with a spectacle lens 41. The display apparatus 1 that is integrated with the spectacle lens 41 is located slightly lower than the center of the spectacle lens 41. As shown in FIG. 6, in general, the field of view of the human eye 10 spans, with reference to the horizontal line HL, from the upper field of view of about 60 degrees to the lower field of view of about 60 degrees, and the distance between the pupil 11 of the eye 10 and the inner surface of the spectacle lens 41 is about 2 mm. Suppose the spectacle lens 41 is disposed in front of the eye 10 and a screen formed of a 1 m-wide virtual image is displayed at 1 m distance. Then, the relationship between the eye 10 and the display apparatus 1 can be set as follows.

That is, the display apparatus 1 is set with respect to the spectacle lens 41 such that the center line CL (a line perpendicularly extending at the center) thereof and the horizontal line HL form an angle α of 5 to 10 degrees. Then, an arbitrary range of an angle β is set such that it spans a necessary area both in the upward and downward directions with reference to the center line CL (β=the upper area βa+the lower area βd). In this example, the upper area βa and the lower area βd have a same angle of about 25 degrees.

FIG. 7 shows eyeglasses 40 using the spectacle lenses 41 shown in FIG. 6. The eyeglasses 40 include, as in typical eyeglasses, a pair of spectacle lenses 41 and 41 and an eyeglass frame 42 that holds the both spectacle lenses 41 and 41. The eyeglass frame 42 includes a pair of lens frames 43 and 43 that hold the pair of spectacle lenses 41 and 41, a bridge 44 that connects the inner sides of the both lens frames 43 and 43, wraparound endpieces 45 provided at the outer sides of the both lens frames 43 and 43, and temples 46 pivotally supported at the wraparound endpieces 45.

The display apparatus 1 built in each of the spectacle lenses 41 is connected to one end of each of a plurality of transparent electrodes 48 made of indium oxide or the like. The other end of each of the plurality of transparent electrodes 48 extends outward to the lens frame 43 and is connected to a contact terminal provided on the inner surface of the lens frame. The contact terminal of the lens frame 43 is electrically connected to one end of a lead wire 49. The other end of the lead wire 49 passes through the wraparound endpiece 45 and the temple 46 and exits out of the rear of the temple 46.

Using the eyeglasses (head mounted display apparatus: HMD) 40 having such a configuration, as shown in FIG. 8, the wearer can view a virtual image 17 enlarged by the lens effect of the microlenses at a position away from the display screen, which is the surface of the element. The image of the boat displayed on the display apparatus 1 of the spectacle lens 41 shown in FIG. 7 is not actually present there, but is diagrammatically depicted for illustration purposes only. The virtual image of the boat can be viewed as shown in FIG. 8.

FIGS. 9 to 11 show an electronic still camera illustrating a first example of an electronic instrument to which the display apparatus 1 according to an embodiment of the invention is applied. The electronic still camera 50 includes a camera body 51 formed of a flat, horizontally longer housing, a lens device that is built in the camera body 51 and having an image-pickup lens 52 exposed outside, a controller that is built in the camera body 51 and controls and drives the lens device and the like, and a display panel 53 that displays an image acquired with the lens device.

The lens device of the electronic still camera 50 is built in on the right side of the camera body 51 when viewed from the front side thereof, and the image-pickup lens 52 is disposed at the upper right of the front side. An electronic viewfinder 54 is disposed on the rear of the camera body 51 at the location corresponding to the image-pickup lens 52. The electronic viewfinder 54 and the display panel 53 display a same image corresponding to a subject. The display panel 53 may be, for example, a flat panel display, such as a liquid crystal display. Furthermore, an operation button 55 is provided next to the display panel 53 on the rear of the camera body 51. The operation button 55 is used to switch display screens on the display panel 53 and select functions in the selected screen. A shutter button 56 is disposed on the upper side of the camera body 51 and used to acquire a still image.

The display apparatus 1 according to an embodiment of the invention can be applied to the electronic viewfinder 54 of the electronic still camera 50 having such a configuration. By mounting the display apparatus 1 on the viewport of the electronic viewfinder 54, as shown in FIG. 11, the user can view a virtual image 17 enlarged by the lens effect of the microlenses at a position away from the display screen, which is the surface of the element. The image of the human face displayed on the electronic viewfinder 54 of the electronic still camera 50 shown in FIG. 10 is not actually present there, but is diagrammatically depicted for illustration purposes only.

FIG. 12 shows an image-pickup instrument to which the display apparatus 1 according to the third example of the invention, in which means for modifying a curved surface is provided to change the radius of curvature of the roughly spherical surface, which is the predetermined curved surface. Although a VTR (video tape recorder) 60 with a camera integrated therein is shown as the image-pickup instrument of this example, the recording medium is not limited to a tape-based recording medium, such as a magnetic tape, but may of course be a disc-based recording medium, such as an optical disc and a magneto-optical disc, as well as other recording media in other forms as long as they are capable of recording and/or reproducing information.

The camera-integrated VTR 60 includes a camera body 61 formed of a flat, horizontally longer housing 61. A lens device 62 is provided at the upper front portion of the camera body 61, and a viewfinder 63 having the display apparatus 1 with a variable curved surface is provided behind the lens device. A viewport 64 of the viewfinder 63 is provided on the rear of the camera body 61. Reference number 65 denotes a piece of optical glass supported at the viewport 64.

The viewfinder 63 includes the display apparatus 1, which is the display portion, and means for modifying a curved surface 70 for changing the curved surface (curvature of the spherical surface) of the display apparatus 1. The display apparatus 1 is configured such that the pressure applied on the surface opposite to the surface where the microlenses 3 that face the human eye 10 are disposed can be changed to change the curvature (radius of curvature) of the curved surface in accordance with the amount of the pressure.

The means for modifying a curved surface 70 includes a retainer 71 that retains the display apparatus 1, a pressure adjuster 73 that can adjust the pressure in a liquid chamber 72 of the retainer 71, a connection pipe 74 that connects the pressure adjuster 73 to the liquid chamber 72 of the retainer 71. The retainer 71 is formed of a hollow case that has a front circular aperture 75 and the liquid chamber 72 formed therein. The display apparatus 1 is fixedly fit in the aperture 75 of the retainer 71. The display apparatus 1 is disposed such that it is convex toward the inside of the liquid chamber 72 and the outer edge of the display apparatus 1 is glued to and integrated with the inner surface of the aperture 75 with an adhesive in a liquid-tight manner.

The pressure adjuster 73 includes a cylinder 76 that communicates with the liquid chamber 72 of the retainer 71 through the connection pipe 74, a piston 77 that is slidably inserted in the chamber of the cylinder 76, a threaded shaft 78 that has one end fixed to the piston 77 and has the other end protruding outward through the end of the cylinder 76 and the rear of the camera body 61, and an operation knob 79 provided at the protruding end of the threaded shaft 78. The liquid chamber 72, cylinder 76 and connection pipe 74 are filled with a power transmitting medium 80, such as oil and water, illustrating one specific example of a pressure transmitting medium.

In FIG. 12, when the operation knob 79 is rotated counter-clockwise to move the piston 77 to the right in the figure, the pressure of the power transmitting medium (liquid) 80 in the cylinder 76 decreases and part of the power transmitting medium 80 in the liquid chamber 72, corresponding to the increased effective volume of the cylinder 76, flows into the cylinder 76. This reduces the pressure in the liquid chamber 72, so that the elasticity of the display apparatus 1 itself changes and restores the state of the display apparatus 1 from that indicated by the solid line to that indicated by the double-dashed line. Then, the display screen of the display apparatus 1 deforms in such a way that the radius of curvature of the curved surface of the display apparatus 1 becomes smaller. Consequently, as described above, the user can view a virtual image 17 enlarged by the lens effect of the microlenses.

In contrast, in FIG. 12, when the operation knob 79 is rotated clockwise to move the piston 77 to the left in the figure, the pressure of the power transmitting medium 80 in the cylinder 76 increases and part of the power transmitting medium 80 corresponding to the decreased effective volume of the cylinder 76 flows into the liquid chamber 72. This increases the pressure in the liquid chamber 72, so that the display apparatus 1 changes, against the elasticity of the display apparatus 1 itself, from the state indicated by the double-dashed line to the state indicated by the solid line. Then, the display screen of the display apparatus 1 deforms in such a way that the radius of curvature of the curved surface of the display apparatus 1 becomes greater. Consequently, as described above, the user can view a virtual image 17 enlarged by the lens effect of the microlenses in a smaller size.

According to this example, the variable, roughly spherical surface, which is the predetermined curve surface of the display apparatus 1, using the means for modifying a curved surface 70 can adjust the diopter of the viewfinder 63 or adjust the size of the viewing screen. For example, when the size of the screen of the viewfinder 63 is variable between 14 inch and 50 inch, the user may freely decide whether viewing images on the 14-inch or 50-inch screen, or may arbitrarily adjust the size of images for viewing. In this example, although the description has been given with reference to the case in which the position of the eye is fixed, the viewfinder 63 may of course be applicable to an eyeglass-type display apparatus (head mounting display apparatus).

As described above, in the display apparatus according to an embodiment of the invention, the plurality of pixels and the plurality of microlenses are disposed on the predetermined curved surface in such a way that they face each other and the light rays that exit from the plurality of microlenses are collected into the eye, so that the viewer can clearly and distinctly view the entire predetermined virtual image. Thus, there can be provided a mobile display and a wearable display that are more compact and lightweight than the apparatus of this type of related art and provide a high definition virtual image viewable on a large screen.

The invention is not limited to the embodiments described above and illustrated in the drawings, but may be implemented in various variations thereof without departing from the spirit of the invention. For example, although the above examples have been described with reference to the cases where the invention is applied to the electronic still camera and the camera-integrated VTR, the invention may of course be applicable to other image-pickup instruments, or may be applied as a display apparatus for not only the eyeglass-type display instrument but also a goggle-type and other display instrument.

It should be understood by those skilled in the art that various modifications, combinations, sub-combinations and alterations may occur depending on design requirements and other factors insofar as they are within the scope of the appended claims or the equivalents thereof.

The invention claimed is:

1. A display apparatus, comprising:
   image display means having a plurality of pixels arranged on a predetermined curved surface, the predetermined curved surface being an approximately spherical surface;
   means for modifying the curved surface to change the radius of curvature of the approximately spherical surface; and
   a plurality of microlenses arranged on the predetermined curved surface such that they correspond to and face the plurality of pixels on the image display means,
   wherein light rays that exit from the plurality of microlenses are collected into the eye, so that a virtual image is placed at a position apart from the eye by at least a distance of distinct vision.

2. The display apparatus according to claim 1, wherein the plurality of pixels are self-luminous display elements.

3. The display apparatus according to claim 2, wherein the self-luminous display elements are based on organic electroluminescence.

4. The display apparatus according to claim 1, wherein the image display means has light emitting portions and a plurality of pixels that control whether the light rays are transmitted or blocked, or control the amount of light transmission, each light emitting portion corresponding to one of the plurality of pixels and illuminating the one pixel.

5. The display apparatus to claim 4, wherein the plurality of pixels are liquid crystal display elements.

6. The display apparatus according to claim 1, wherein the curved surface is a spherical surface in which the radius of curvature is constant across the surface.

7. The display apparatus according to claim 1, wherein an optical lens is disposed between the microlenses and the eye.

8. A display apparatus, comprising:
   an image display unit having a plurality of pixels arranged on a predetermined curved surface, the predetermined curved surface being an approximately spherical surface; and
   a plurality of microlenses arranged on the predetermined curved surface such that they correspond to and face the plurality of pixels on the image display unit,
   wherein light rays that exit from the plurality of microlenses are collected into the eye, so that a virtual image is placed at a position apart from the eye by at least a distance of distinct vision;
   whereby the curved surface can be modified to change the radius of curvature of the approximately spherical surface.

* * * * *